(12) United States Patent
Spitz et al.

(10) Patent No.: US 7,521,774 B2
(45) Date of Patent: Apr. 21, 2009

(54) SEMICONDUCTOR DIODE AND METHOD FOR THE PRODUCTION THEREOF

(75) Inventors: Richard Spitz, Reutlingen (DE); Alfred Goerlach, Kusterdingen (DE); Dana Keppeler, Immenstaad (DE)

(73) Assignee: Robert Bosch GmbH, Stuttgart (DE)

( * ) Notice: Subject to any disclaimer, the term of this patent is extended or adjusted under 35 U.S.C. 154(b) by 434 days.

(21) Appl. No.: 10/528,712

(22) PCT Filed: Jun. 3, 2003

(86) PCT No.: PCT/DE03/01809

§ 371 (c)(1),
(2), (4) Date: Sep. 21, 2005

(87) PCT Pub. No.: WO2004/030107

PCT Pub. Date: Apr. 8, 2004

(65) Prior Publication Data

US 2006/0097280 A1 May 11, 2006

(30) Foreign Application Priority Data

Sep. 20, 2002 (DE) .................. 102 43 813

(51) Int. Cl.
*H01L 29/861* (2006.01)

(52) U.S. Cl. ............... 257/606; 257/605; 257/603; 257/487; 257/E29.327

(58) Field of Classification Search ................ 257/104, 257/603

See application file for complete search history.

(56) References Cited

U.S. PATENT DOCUMENTS

| 4,999,683 | A  | * | 3/1991 | Kiyomura et al. | ........... 257/606 |
| 6,716,714 | B1 | * | 4/2004 | Goebel et al. | ............... 438/380 |
| 2002/0070380 | A1 | | 6/2002 | Andoh | |
| 2002/0072207 | A1 | | 6/2002 | Andoh | |
| 2002/0127890 | A1 | | 9/2002 | Andoh | |

FOREIGN PATENT DOCUMENTS

| DE | 43 20 780 | 3/1995 |
| WO | 01 13434 | 2/2001 |

\* cited by examiner

*Primary Examiner*—Thao X Le
*Assistant Examiner*—Robert Huber
(74) *Attorney, Agent, or Firm*—Kenyon & Kenyon LLP

(57) ABSTRACT

In a semiconductor system 20 made up of multiple sublayers, a sublayer over the largest part of a cross-sectional area BC in the interior of the semiconductor system borders immediately on the first sublayer, while bordering on a second sublayer only in a comparatively narrow edge region of the cross-sectional area. The semiconductor system is characterized by a low bulk resistance and a high breakdown voltage in the edge region. In addition, a method for manufacturing this semiconductor system is specified.

14 Claims, 4 Drawing Sheets

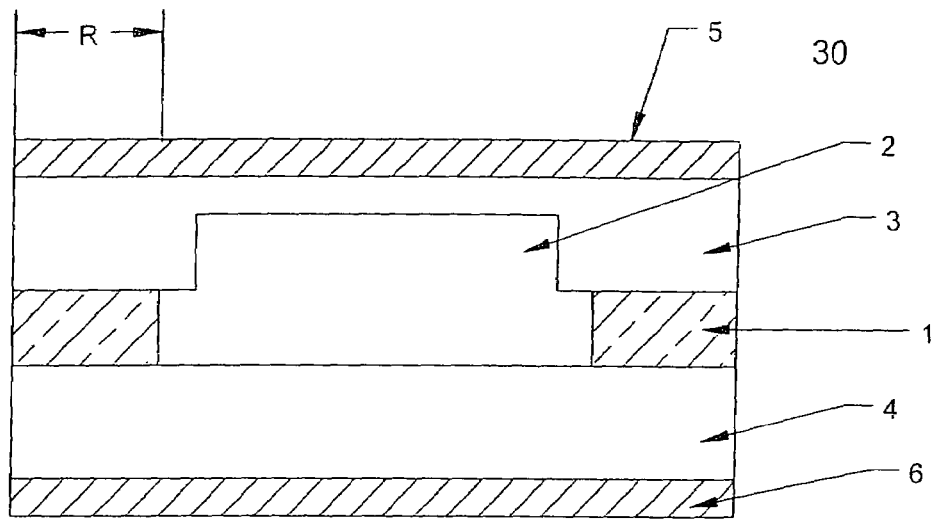
Fig.3
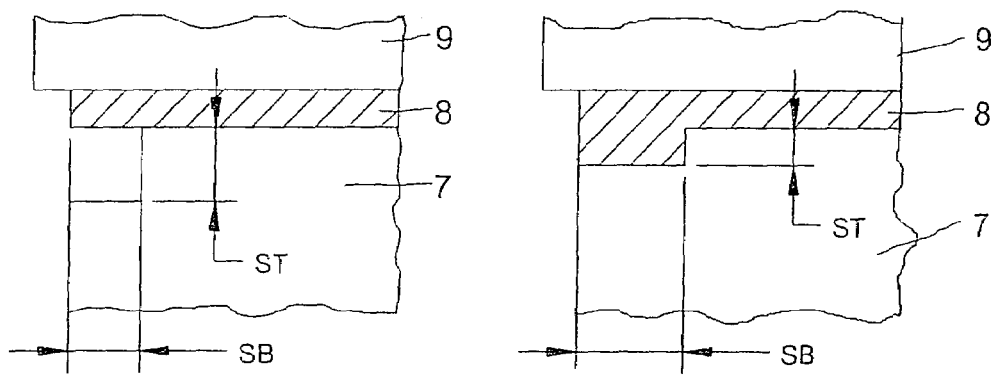
Fig.4a   Fig.4b
Fig.4

SEMICONDUCTOR DIODE AND METHOD FOR THE PRODUCTION THEREOF

FIELD OF THE INVENTION

The present invention relates to a semiconductor system.

BACKGROUND INFORMATION

German Patent Document No. 43 20 780 refers to a semiconductor diode, in which the doping profile at the edges of the diode deviates from the doping profile at the center. This can be used so that in reverse-biased operation the voltage breakdown, which sets in at breakdown voltage UZ, occurs only in the central part of the diode and not at the edge. This results in a high robustness in operation since no avalanche breakdown can occur at the chip edges.

German Patent Document No. 43 20 780 further refers to a semiconductor system having a p-n junction, in particular a diode, which takes the form of a chip having an edge region, which is constructed of a first layer of a first conductivity type and a second layer of the opposite conductivity type, the second layer being made up of at least two sublayers. In this instance, the first sublayer has a first dopant concentration, while the second sublayer has a second dopant concentration which is lower than the first dopant concentration. Together with the first layer, both sublayers form a p-n junction, the p-n junction of the first layer with the first sublayer being formed exclusively in the interior of the chip and the p-n junction between the first layer and the second sublayer being formed in the edge region of the chip.

The available semiconductor system has the distinction of having a high robustness in operation since, due to the special form of the doping profile in the edge region, no voltage breakdown occurs in the edge region in reverse-biased operation of the semiconductor system. It is disadvantageous, however, that this semiconductor system has a relatively high electrical resistance as a result of its lightly doped middle layer. This high electrical resistance causes an undesired voltage drop, which has an adverse effect particularly in breakdown operation. This is all the more pronounced the higher the breakdown voltage UZ of the semiconductor system. For this reason, this semiconductor system is not suited for higher breakdown voltages, as required, for example, for use in a 42 volt vehicle electrical system.

SUMMARY OF THE INVENTION

The semiconductor system according to the present invention avoids this disadvantage due to its special layer structure. Hence it is excellently suited for use in vehicle electrical systems that operate at a voltage higher than 24 volts. Furthermore, the semiconductor system according to the present invention is characterized by a lower reverse current, a more robust behavior in the event of temperature changes as well as a higher pulse strength. The lower reverse current and the higher pulse strength are due to the fact that, in the semiconductor system according to the present invention, the space charge region at the edge region of semiconductor system 10 extends further than in its central region, thereby lowering the electric field strength at the surface of the edge region. As a consequence of the low reverse currents, it is also possible to dispense with a removal of the damage zone, for example by etching.

BRIEF DESCRIPTION OF THE DRAWINGS

FIG. 3 shows a second exemplary embodiment of a semiconductor system according to the present invention.

FIG. 4a shows a comparison of the saw trench geometry between a known semiconductor system.

FIG. 4b shows a semiconductor system according to the present invention in detail in a sectional view.

DETAILED DESCRIPTION

Figure 1:
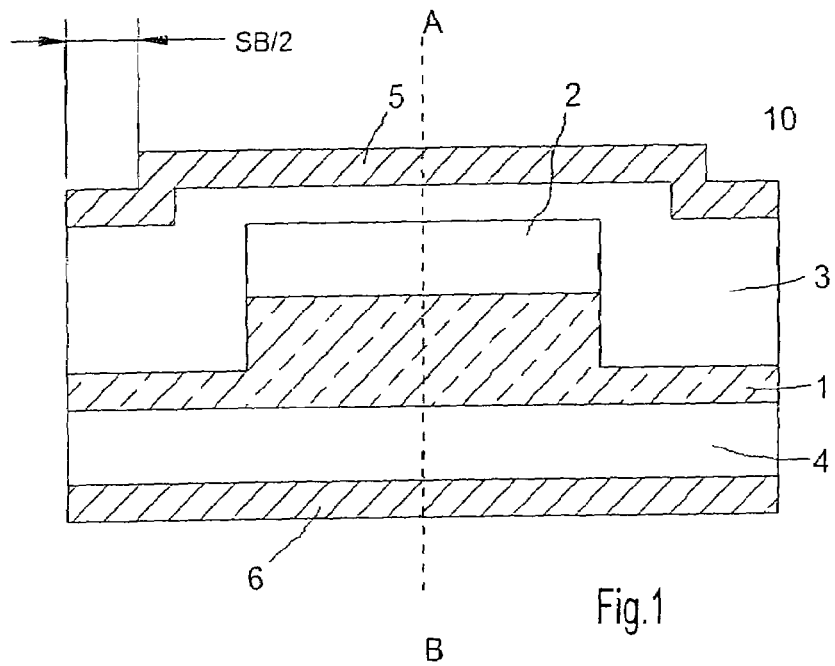
FIG. 1 shows a known semiconductor system in a schematic sectional view.

FIG. 1 first shows a known semiconductor system 10 made up of several variably doped layers 1, 2, 3, 4. Layers 1, 2, 4 are n-doped at different concentrations, while layer 3 is a p-doped layer. The outer surfaces of layers 3 and 4 are coated with contact layers 5, 6 made of metal. This semiconductor system 10 is a diode for example. Together with the n-doped layers 1, 2, p-doped layer 3 forms a p-n junction. Since higher n-doped layer 2 is essentially found only at the center of the semiconductor system, the doping profile at the edges of the diode differs from the doping profile in the central region of the diode. Hence, in reverse-biased operation of the diode, a voltage breakdown at a breakdown voltage UZ essentially only occurs in the central region of the diode and not in its edge region. To be sure, this results in a high robustness in operation since no avalanche breakdown can occur in the edge region of the diode. It is particularly disadvantageous for applications of the diode at higher voltages, however, that the diode has a comparatively high electrical resistance as a consequence of weakly n-doped layer 1. This resistance causes an undesired voltage drop, which has an adverse effect particularly in breakdown operation. This is all the more pronounced the higher the breakdown voltage UZ of the diode. For this reason, a conventional diode of this type is not suited for higher breakdown voltages, as are required, for example, for use in vehicle electrical systems that have a 42 V operating voltage. The proposed invention eliminates this disadvantage.

Figure 2:
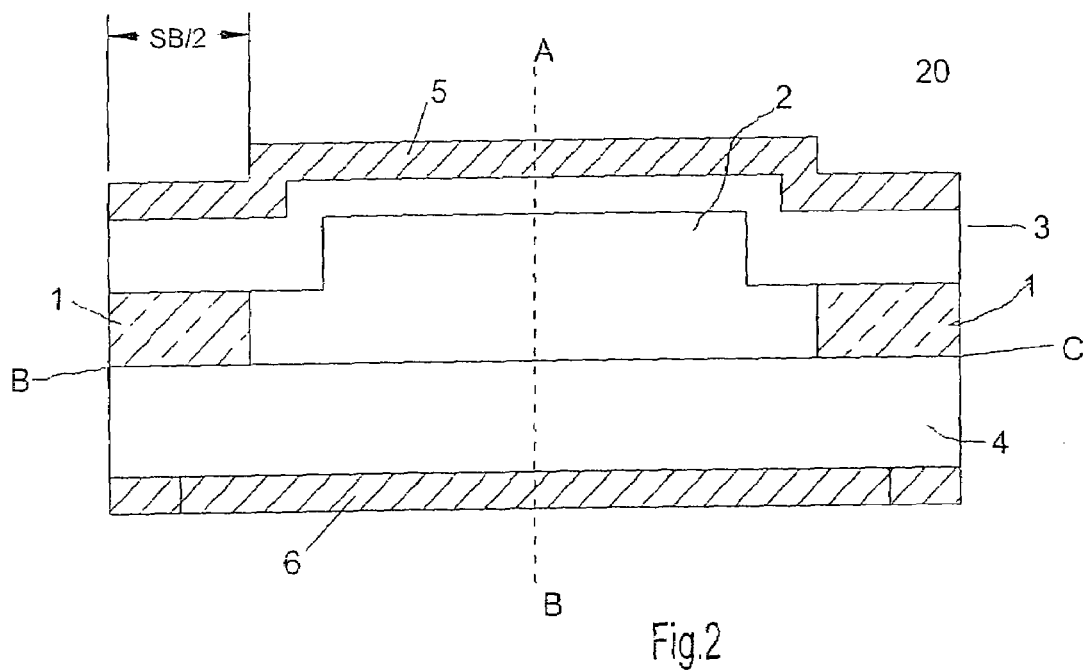
FIG. 2 shows a first exemplary embodiment of a semiconductor system according to the present invention in a schematic sectional view.

In a schematic sectional view, FIG. 2 shows as the first exemplary embodiment of the present invention a semiconductor system 20 made up of multiple sublayers featuring different doping. The starting point is a weakly n-doped semiconductor substrate, which forms a first sublayer 1. In the central region of this semiconductor substrate, a second n-doped sublayer 2, which, however, does not extend to the edge regions of sublayer 1, is introduced from the upper side. Likewise from the upper side, a third p-doped sublayer 3 extends to the n-doped sublayer 2 in the central region and to the n-doped sublayer 1 in the edge region of semiconductor system 20. The boundary regions between sublayers 3 and 2 and between 3 and 1 form the p-n junctions. 5 and 6 designate metallic contact layers that are deposited on the outer surfaces of sublayers 3 and 4. Since the n-doping concentration of sublayer 2 is greater than the n-doping concentration of sublayer 1, the breakdown voltage UZM of the p-n junction 3-2 lying in the central region of semiconductor system 20 between sublayers 3 and 2 is smaller than the breakdown voltage UZR of the p-n junction 3-1 lying in the edge region of semiconductor system 20 between sublayers 3 and 1.

This ensures that also in the semiconductor system according to the present invention a breakdown can occur only in the central region of semiconductor system 20 and not in its edge region. As a consequence of the charge neutrality, the space charge region in the edge region of semiconductor system 20 extends further than in its central region. This has the consequence that the electric field strength is reduced at the surface of the edge region of semiconductor system 20. This advantageously results in a lower reverse current and a higher pulse strength. As a consequence of the low reverse current, it is also possible advantageously to dispense with a removal of the damage zone, for example by an additional etching process. From the backside of semiconductor system 20 a heavily n-doped further sublayer 4 extends out to n-doped sublayer 2 and lightly n-doped sublayer 1. In contrast to the conventional semiconductor system 10 represented in FIG. 1, a lightly n-doped sublayer 1 remains only in a narrow edge region between the n-doped sublayers 3 and 4. In the central region of semiconductor system 20, therefore, the n-doping concentration is higher than the basic doping of first sublayer 1 in the semiconductor system. The avoidance according to the present invention of a lightly n-doped sublayer 1 between sublayers 3 and 4 in semiconductor system 20 achieves a significantly lower bulk resistance than in a conventional semiconductor system. In the event of a breakdown, this advantageously results in a lower voltage drop.

A further exemplary embodiment of the semiconductor system of the present invention is represented in a schematic cross-sectional view in FIG. 3. In contrast to semiconductor system 20 represented in FIG. 2, this semiconductor system 30 has no depression in its edge region. This makes it possible to achieve an even higher breakdown voltage UZR in the edge region of semiconductor system 30 with all the associated advantages such as a lower reverse current and a higher pulse strength, while maintaining the same overall thickness of semiconductor systems 20, 30.

Figure 6:
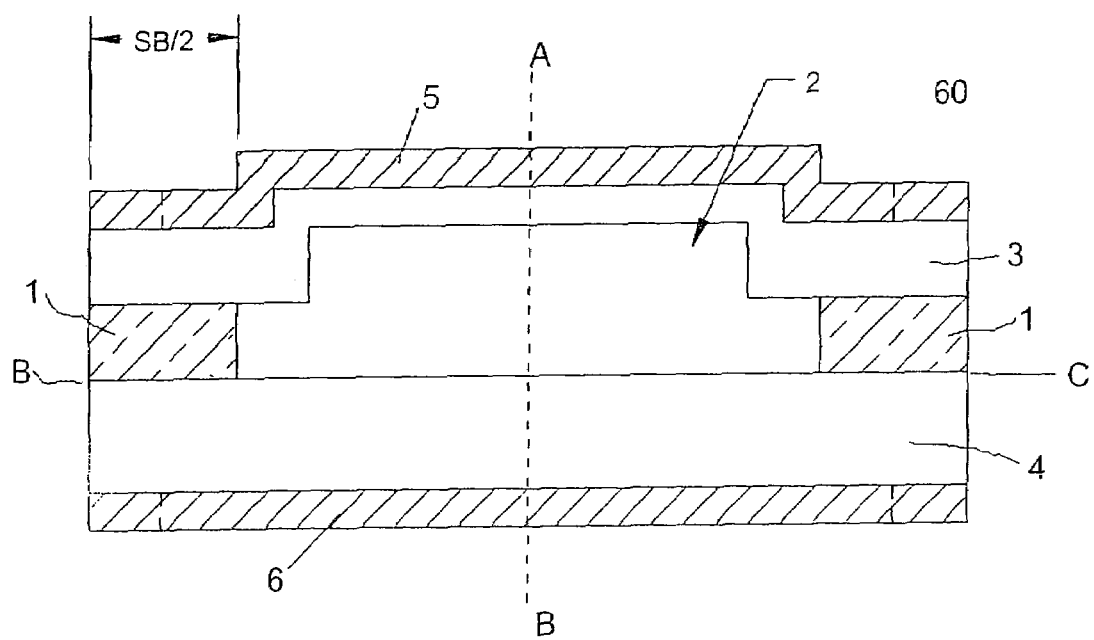
FIG. 6 shows a further exemplary embodiment of the present invention, in which contiguous layers of the semiconductor system are made of the same doping type.

A further exemplary embodiment of the semiconductor system according to the present invention is represented in FIG. 6. In contrast to semiconductor systems 20 and 30 in FIG. 2 and FIG. 3, sublayer 2 is made of the same doping type as sublayer 3.

Furthermore, exemplary embodiments are conceivable in which the starting material of sublayer 1 is not doped homogeneously. Rather, this sublayer 1 is deposited as an epitaxy layer on an already heavily doped sublayer 4.

In the following, a particularly advantageous manufacturing method for manufacturing a semiconductor system having the layer structure represented in FIG. 2 is described with reference to FIG. 2. The manufacture of a diode having a Zener voltage UZ of approximately 50 volts is described as an example. Of course, using the method according to the present invention, diodes may be provided that are for higher or lower Zener voltages. Thus it is possible, for example, to produce a Zener voltage of approximately 20 volts by a simple variation of the doping profile. One starts from a semiconductor substrate made of silicon having a thickness of approximately 180 µm and an n-doping of approximately $1*10^{16}$ cm$^{-3}$, which forms first sublayer 1 of semiconductor system 20. This sublayer 1 is doped with phosphorus on the upper and lower side. This can be done advantageously using ion implantation, doping glasses, doping foils or, particularly suitably, by a method referred to as the APCVD method (atmospheric pressure chemical vapor deposition). In a particularly simple and economical way, the doping of sublayer 1 by phosphorus atoms can also occur in a gas phase. To this end, sublayer 1 is exposed to an atmosphere of POCl$_3$ at an elevated temperature. Temperatures approximately between 830° C. and 890° C. are suitable for this purpose, particularly a temperature of 870° C. Following the doping process, the glass layers remaining on the semiconductor substrate are removed by an etching process using diluted hydrofluoric acid. If doping glasses are used for doping, then the deposition of the doped glasses is followed by a so-called drive-in step to drive the doping atoms into the semiconductor substrate to be doped, that is, the first sublayer 1. A drive-in step of 20 to 40 minutes, particularly 30 minutes, has proved to be especially favorable. This drive-in step is suitably performed at an elevated temperature of approximately 1200 to 1300, particularly of 1265° C. Following this doping step, the integral over the concentration of phosphorus atoms, the dose, amounts on each doped side of first sublayer 1 to approximately $2*10^{16}$ cm$^{-2}$ The penetration depth of the phosphorus atoms into the n-doped semiconductor material of first sublayer 1 is approximately 5-15 micrometers. In the case of a POCl$_3$ gas phase deposition it is less than approximately 1 micrometer. Subsequently, the upper side of doped first sublayer 1 is structured. This can occur in a particularly advantageous manner by saw cuts into the upper side using a diamond saw or by water-supported laser cutting. The sawing depth ST (FIG. 4) is approximately 1-35 micrometers. As a rule, the sawing depth ST is suitably chosen in such a way that it is greater than the penetration depth of the phosphorus atoms in the surface of sublayer 1. A suitable choice of the sawing depth ST can substantially influence the lateral out-diffusion of the phosphorus layer or the phosphorus concentration and thus the breakdown field strength in the edge region of semiconductor system 20 during the subsequent diffusion process. The width SB of the saw blade used also depends on the desired sawing depth and the subsequent diffusion process. Saw widths SB (FIGS. 1, 2, 4b, 6) in the order of approximately 300 micrometers are typical. Following this mechanical structuring process, a further diffusion process is performed, in which the n-dopants are driven into the semiconductor substrate. This drive-in may occur in an oxidizing atmosphere, suitably in dry or also in wet oxygen. As a variation, a diffusion in an atmosphere made of pure nitrogen or a nitrogen-oxygen mixture is possible as well. This diffusion process is also carried out at a high temperature between 1200 and 1300° C., particularly at a temperature of 1265° C. The semiconductor substrate is exposed to this temperature for approximately 140 hours. During the diffusion process, the semiconductor substrate is positioned on a suitable carrier, which may be made of SiC or a similar temperature-resistant material. Following the previously described diffusion process, the layer of SiO$_2$ thereby produced on the surface of the semiconductor substrate is etched off again. In order to increase the efficiency of the method, in principle multiple semiconductor substrates can be piled into a stack and be jointly exposed to the diffusion process. For this purpose, so-called neutral foils (neutral preforms) are suitably arranged between the individual semiconductor substrates. These neutral foils contain antitack agents such as pellets made of SiC or Al$_2$O$_3$ for example and thus prevent the semiconductor substrates from sticking together. Following a successful conclusion of the diffusion process, the individual semiconductor substrates are again separated from one another using diluted hydrofluoric acid. In a subsequent further diffusion process, an additional sublayer 3 is now applied which is p-doped. At the same time, the concentration of the doping atoms in sublayer 4 is to be increased further. In principle, all doping methods familiar to one skilled in the art are suited for this purpose. The use of so-called doping foils, however, is particularly advantageous. For this purpose, alternately p-doping foils and n-doping foils together with the semiconductor substrates are again piled up into stacks and heated together. This process step requires a time of approximately 30 hours at a temperature of 1265° C. Especially advantageous in this implementation of the method is the fact that sublayers 3 and 4 can be produced together in one single diffusion step. As already described above, following the conclusion of the diffusion step, the individual semiconductor substrates are again separated from one another using diluted hydrofluoric acid.

Figure 5:
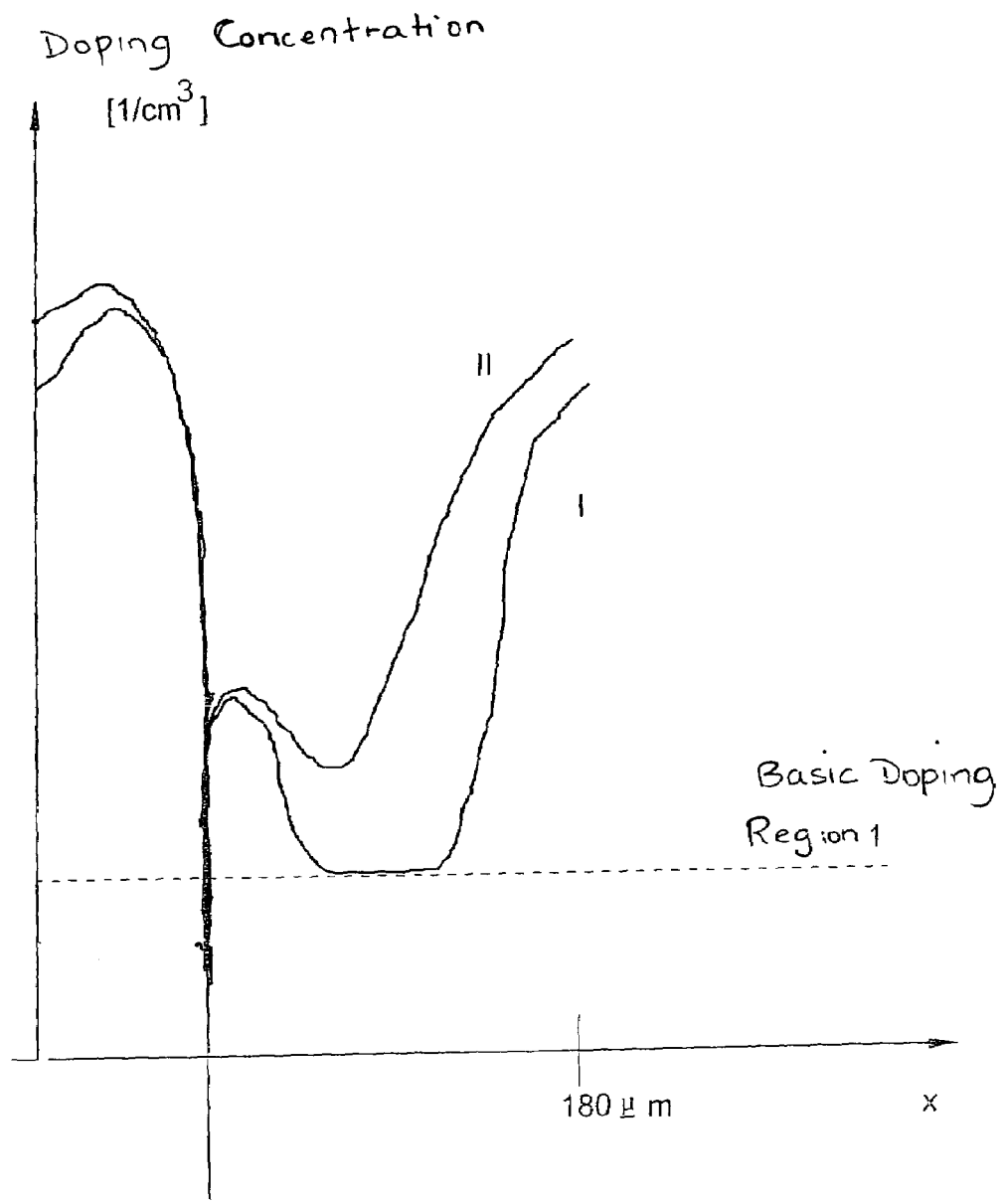
FIG. 5 shows a diagram of the schematic representation of the doping profiles of the known semiconductor system and of the semiconductor system according to the present invention in comparison along section AB.

The diffusion profile in the central region (compare step AB in FIG. 2) of a diode manufactured in the previously described manner is represented in the diagram in FIG. 5 (curve shape II). This diagram shows the doping concentration as a function of the distance x. As a special feature it may be pointed out that the minimum doping concentration in this diode is greater than the basic doping of the semiconductor substrate, that is, the doping of first sublayer 1 in FIG. 2 or 3.

In contrast to the conventional structure of a semiconductor system according to FIG. 1, in which the sawing-in process only occurs after the diffusion of n-doped sublayer 2, in the approach according to the exemplary embodiment and/or exemplary method of the present invention a smaller sawing depth ST can be chosen than in the conventional semiconductor system. Since the portion of first sublayer 1 still remaining is greater than in the conventional design approach, it is possible to achieve higher breakdown voltages UZR in the edge region of the semiconductor structure according to the present invention. If, as in the conventional semiconductor structure, it is not possible to select a sawing depth that is sufficiently small because the sawing-in process occurs only after the first diffusion treatment of n-doped sublayer 2, p-doped third sublayer 3 diffuses together with n-doped sublayer 4 in the edge region of the semiconductor system. This, however, greatly reduces the breakdown voltage UZR.

In a further exemplary method according to the present invention, the previously described joint diffusion of p-doped sublayer 3 and n-doped sublayer 4 can also be split up into two partial steps. To this end, the dopants are initially introduced in the first partial step and are then driven in further in a second partial step. Again, the doping and diffusion methods already described above can be used for this purpose. In particular, it is possible to use stack diffusion and diffusion in boots or a combination of both methods.

Subsequently, the upper side and the lower side of the semiconductor substrate are each provided with one contact layer 5, 6 made of metal (FIG. 2). However, a complex layer sequence made of several metals may be deposited for this purpose. The combination chromium, nickel, silver, for example, is particularly well suited.

Following the metallization of the contact regions of the semiconductor substrates, the individual semiconductor systems, that is, diodes in the exemplary embodiment described, are separated from one another for example by sawing using a diamond saw. Customarily, saw blades of a width of 40 micrometers are used for this purpose. This sawing process yields individual diodes, which are normally additionally equipped with a housing. The diode is soldered into the housing and is protected by it.

In unfavorable sawing condition that depend, for example, on the grain size of the diamond splinters of the saw, the rotational speed and the feed rate, the separation of the semiconductor substrates with the aid of a diamond saw can cause faulty crystal zones in the edge region of semiconductor system 20, 30, 60. These faulty crystal zones in turn give rise to undesired additional reverse currents in the operation of the semiconductor system. Thus the faulty crystal zones are normally removed in an additional method step, by etching for example. In semiconductor system 20, 30, 60 according to the exemplary embodiment and/or exemplary method of the present invention, however, breakdown voltage UZR in the edge region of the semiconductor system is significantly higher than in a conventional semiconductor system such as the one according to FIG. 1. Hence the ratio of the breakdown voltage UZR at the edge region of semiconductor system to the breakdown voltage UZM in the central region of the semiconductor system is also significantly higher. This has the consequence that in the semiconductor system configured according to the present invention, the reverse current originating from the possibly faulty edge region is significantly lower.

Thus in most cases it is also not necessary to remove the faulty crystal zones (damage zones) in the edge region of the semiconductor system according to the present invention. This results in a simplification of the manufacturing method and thus to an additional reduction in cost.

If the faulty edge regions are removed nevertheless, as is described in the following, a yet significantly lower reverse current is achieved. Wet-chemical etching methods using KOH, gas phase etching or similar methods lend themselves for removing the faulty edge regions of the semiconductor system. However, since in contrast to conventional semiconductor systems only very shallow sawing trenches are required, a wet-chemical etching method using KOH or a comparable etching solution lends itself especially well. In a conventional semiconductor system according to FIG. 1, the required sawing trench is particularly deep and narrow. For example, the ratio of sawing width SB to sawing depth ST is 2.5. In semiconductor system 20 according the present invention as shown in FIG. 2, by contrast, the ratio of sawing width SB to sawing depth ST is 15 for example. These ratios are represented in FIG. 4 by partial figures FIG. 4a and FIG. 4b. In both figures, an enlarged detail of an edge region of a semiconductor system is shown in cross section. The semiconductor substrate is identified by 7. Reference numeral 8 designates a solder layer. Reference numeral 9 indicates a heat sink made of copper for example. The sawing width is indicated by the letter combination SB and the sawing depth by ST.

A conventional semiconductor system is represented in FIG. 4a, while FIG. 4b shows a semiconductor system according to the present invention. As FIG. 4b clearly shows, in the semiconductor system according to the present invention, solder layer 8 completely fills the sawing trench indicated by sawing width SB and sawing depth ST. This has the advantage that in a subsequent wet-chemical etching process contact layer 5 or the semiconductor material below it are no longer attacked in the region of the sawing trench since they are completely covered by solder layer 8. Moreover, a sawing trench filled completely with ductile solder material offers the advantage that the semiconductor substrate is relieved mechanically if as a result of temperature change stresses, pressure and/or shearing forces are exerted on the semiconductor system. In addition, the dissipation of heat from the semiconductor substrate is further improved. The advantages described above, by contrast, cannot be obtained with the embodiment of a conventional semiconductor system shown in FIG. 4a.

A further exemplary embodiment of a semiconductor system 30 according to the present invention is represented schematically in FIG. 3 in cross section. In this case, a depression of the semiconductor substrate in the edge region was dispensed with completely. This allows for an even higher breakdown voltage UZR in the edge region, while maintaining the same thickness of the semiconductor substrate as in semiconductor system 20 in FIG. 2. This results in further advantages such as a lower reverse current and a greater pulse strength. The structural design and the manufacturing method are practically identical as in the exemplary embodiment of the present invention described above with reference to FIG. 2. The structuring of n-doped layer 2, however, may also occur advantageously by method steps known from conventional photolithography and planar technology. These method steps include in particular the steps of thermal oxidation, photo-resist coating, pre-curing, exposure and curing of the photo-resist, etching of the contact windows and stripping of the photo-resist. In sufficiently thick thermal oxide layers, the oxide layer may advantageously also act as a diffusion barrier for the phosphorus atoms to be introduced into the semiconductor substrate. In the high diffusion temperatures used, the oxide layer must have a thickness of 3-5 micrometers. The structuring occurs in such a way that in the central region of the semiconductor substrate no oxide layer remains, while at its edge R, however, an oxide layer does remain. This structuring step is followed by the process steps already described above, beginning with the doping of n-doped layer 2.

A further exemplary embodiment of a semiconductor system 60 according to the present invention is represented schematically in a cross section in FIG. 6. Deviating from the exemplary embodiment of semiconductor system 20 in FIG. 2, sublayer 2 is doped with boron instead of phosphorus. In contrast to semiconductor system 20, reverse current UZM at the center of the semiconductor system is determined by the junction between sublayers 2-4 and not by the junction between sublayers 3-2.

In principle, exemplary embodiments are possible as well in which starting material 1 is not available in homogeneously doped form but rather as an epitaxy layer that is deposited on an already heavily doped substrate 4.

Even if semiconductor diodes, particularly Zener diodes, are represented in the figures, the disclosure according to the exemplary embodiment and/or exemplary method of the present invention can also be applied to other semiconductor systems which have a p-n junction between a heavily doped p-layer and a heavily doped n-layer followed by a more weakly doped n-layer. Likewise semiconductor components are possible in which all p-layers and n-layers are interchanged.

The List of Reference Characters is as follows:
1 Doped layer
2 Doped layer
3 Doped layer
4 Doped layer
5 Contact layer
6 Contact layer
7 Semiconductor substrate
8 Solder layer
9 Heat sink
10 Semiconductor system
20 Semiconductor system
30 Semiconductor system
60 Semiconductor system
SB Sawing width
ST Sawing depth
R Edge

What is claimed is:

1. A semiconductor system having a p-n junction, comprising:
a substrate having an edge region, which is made up of a first layer of a first conductivity type and a second layer of an opposite conductivity type, the second layer being made up of at least two sublayers, wherein:
the first sublayer has a first dopant concentration,
the second sublayer has a second dopant concentration that is lower than the first dopant concentration,
both sublayers together with the first layer form a p-n junction, the p-n junction of the first layer with the first sublayer being formed exclusively in an interior of the chip and the p-n junction between the first layer and the second sublayer being formed in the edge region of the chip,
the second layer includes a third sublayer having a third dopant concentration that is higher than the first dopant concentration and significantly higher than the second dopant concentration,
the third sublayer over a largest part of its cross-sectional area in the interior of the semiconductor system borders immediately on the first sublayer, while bordering on the second sublayer only in a comparatively narrow edge region of the cross-sectional area, wherein the first sublayer has a portion with a thickness greater than the second sublayer.

2. The semiconductor system of claim 1, wherein the sublayers of the semiconductor system at least one of touch in a central region of the semiconductor system, and overlap in regions.

3. The semiconductor system of claim 1, wherein a dopant concentration in each of the sublayers is higher than a dopant concentration in the sublayer forming the basic substrate.

4. The semiconductor system of claim 1, wherein in its central region the sublayers form a first p-n junction between a p+-doped and an n+-doped semiconductor substrate.

5. The semiconductor system of claim 1, wherein in its edge region the sublayers form a second p-n junction between a p+-doped and an n−-doped semiconductor substrate.

6. The semiconductor system of claim 1, wherein it has in its edge region a wide, shallow sawing trench having a sawing width and a sawing depth, the sawing width being at least one of greater than 80 micrometers and 100 micrometers, and wherein a ratio of the sawing width to the sawing depth has a value greater than 3.

7. The semiconductor system of claim 1, wherein the sawing trench is completely filled with solder material so that the wall surfaces of the sawing trench are covered by solder material and are protected by this solder material.

8. The semiconductor system of claim 1, wherein the semiconductor system is part of a diode.

9. The semiconductor system of claim 1, wherein a breakdown voltage in the edge region of the semiconductor system is significantly greater than a breakdown voltage in a central region of the semiconductor system.

10. The semiconductor system of claim 9, wherein the breakdown voltage in the edge region is greater than the breakdown voltage approximately by a factor of 2 to 7.

11. The semiconductor system of claim 1, wherein a bulk resistance in a central region of the semiconductor system is lower than the bulk resistance in an edge region of the semiconductor.

12. A semiconductor system having a p-n junction, comprising:
a substrate having an edge region, which is made up of a first layer of a first conductivity type and a second layer of an opposite conductivity type, the second layer being made up of at least two sublayers, the first sublayer having a first dopant concentration and the second sublayer having a second dopant concentration that is lower than the first dopant concentration, both sublayers together with the first layer forming a p-n junction, the p-n junction of the first layer with the first sublayer of the second layer being formed exclusively in an interior of the chip and a p-n junction between the first layer and the second sublayer being formed in an edge region of the chip, wherein a layer over a largest part of a cross-sectional area in the interior of the semiconductor system borders immediately on the first layer, while bordering on the second layer only in a comparatively narrow edge region of the cross-sectional area, wherein the first sublayer has a portion with a thickness greater than the second sublayer.

13. A method for manufacturing a semiconductor system, comprising:

manufacturing a semiconductor substrate of a first conductivity type forming a first sublayer of the semiconductor system;

doping the first sublayer on both sides for forming two further sublayers of the same conductivity type as the first sublayer but with different degrees of doping so that the two sublayers touch or overlap at most in a central region of the semiconductor system;

producing a fourth sublayer of an opposite conductivity type by introducing a dopant into the sublayers and by increasing the dopant concentration of the sublayer;

covering outer surfaces of the sublayers with metallic contact layers;

wherein the semiconductor system has a p-n junction, including a substrate having an edge region, which is made up of the first layer of a first conductivity type and a second layer of an opposite conductivity type, the second layer being made up of at least two sublayers, wherein:

the first sublayer has a first dopant concentration, the second sublayer has a second dopant concentration that is lower than the first dopant concentration, both sublayers together with the first layer form a p-n junction, the p-n junction of the first layer with the first sublayer being formed exclusively in an interior of the chip and the p-n junction between the first layer and the second sublayer being formed in the edge region of the chip, the second layer includes a third sublayer having a third dopant concentration that is higher than the first dopant concentration and significantly higher than the second dopant concentration, the third sublayer over a largest part of its cross-sectional area in the interior of the semiconductor system borders immediately on the first sublayer, while bordering on the second sublayer only in a comparatively narrow edge region of the cross-sectional area, wherein the first sublayer has a portion with a thickness greater than the second sublayer.

14. The semiconductor system of claim 1, wherein p-doped and n-doped layers are interchanged.

* * * * *